United States Patent
Ando

(10) Patent No.: US 6,319,791 B1
(45) Date of Patent: *Nov. 20, 2001

(54) SEMICONDUCTOR DEVICE MANUFACTURING METHOD AND SEMICONDUCTOR DEVICE

(75) Inventor: Masateru Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/427,090

(22) Filed: Oct. 26, 1999

(30) Foreign Application Priority Data

Oct. 27, 1998 (JP) .................................................. 10-304904

(51) Int. Cl.⁷ .................................................. H01L 21/76
(52) U.S. Cl. ........................... 438/401; 438/462; 257/797
(58) Field of Search .................................... 438/401, 462, 438/800; 257/797, 798

(56) References Cited

U.S. PATENT DOCUMENTS 5,640,053 * 6/1997 Caldwell .............................. 257/797

FOREIGN PATENT DOCUMENTS

| 1-272116 | 10/1989 | (JP) . |
| 4-159706 | 6/1992 | (JP) . |
| 6-112102 | 4/1994 | (JP) . |
| 9-74063 | 3/1997 | (JP) . |
| 9-232221 | 9/1997 | (JP) . |
| 9-251945 | 9/1997 | (JP) . |
| 9-306821 | 11/1997 | (JP) . |
| 10-22194 | 1/1998 | (JP) . |
| 10-125751 | 5/1998 | (JP) . |

OTHER PUBLICATIONS

Japanese Office Action dated Jan. 9, 2001, with partial English translation.

* cited by examiner

Primary Examiner—Charles Bowers
Assistant Examiner—Craig Thompson
(74) Attorney, Agent, or Firm—McGinn & Gibb, PLLC

(57) ABSTRACT

A semiconductor device manufacturing method and a semiconductor device whereby alignment accuracy of a lower-layer pattern and an upper-layer pattern in a photolithography process may be improved. There are provided a pair of box marks for measuring the relative position between a lower-layer pattern and an upper-layer pattern of a semiconductor device in a box mark formation region. Since one box mark of the pair of box marks includes an opening groove 9-*a* formed on an interlayer insulating film 7 and a slit 9-*b* with a rectangular shape having a center roughly the same as the center of the opening groove 9-*a*, while the other box mark of the pair of box marks is an alignment mark 11-*a* formed on the opening groove, it is possible to suppress the change in shape of the edge part of the opening groove 9-*a* to a minimum even if reflow occurs again in the interlayer insulating film 7.

10 Claims, 6 Drawing Sheets

(A)

(B)

(A)

(B)

(C)

(D)

(E)

(F)

(G)

(A)

(B)

(A)

(B)

(C)

(D)

(E)

(F)

212 Waveform of data showing misalignment measurement results

SEMICONDUCTOR DEVICE MANUFACTURING METHOD AND SEMICONDUCTOR DEVICE

BACKGROUND OF THE INVENTION

1. Field of the Invention

The present invention relates to a semiconductor device and a semiconductor device manufacturing method. In particular, in photolithography processes among the manufacturing processes for semiconductor devices, it relates to a semiconductor device and a semiconductor device manufacturing method which improve the accuracy of alignment for achieving the optimum relative positional relationship between a pattern existing on a semiconductor substrate and a design pattern for the next process.

2. Description of the Prior Art

The development of super-high-integrated semiconductor devices has progressed in recent years. Along with this development, there is strong demand for further improvement in the alignment accuracy of masks in photolithography processes, which are essential to the formation of semiconductor elements, in order to promote further miniaturization and greater integration of semiconductor elements.

Conventionally, in the manufacture of a semiconductor device, patterns made up of films of various materials such as metal films, semiconductor films, insulating films or the like are sequentially stacked on a semiconductor substrate, and semiconductor elements with fine structures are formed. When stacking patterns for such semiconductor elements, in photolithography processes it is necessary to line up and form a next upper-layer pattern on top of a lower-layer pattern formed in a previous process.

In photolithography processes, a mask pattern is lined up with the lower-level pattern according to prescribed specifications when the photolithography process is performed for an upper-layer pattern. Higher alignment accuracy in the lining up of such patterns is required as semiconductor devices become increasingly fine and more highly integrated, and there is a need for techniques to raise alignment accuracy.

Alignment accuracy is generally calculated by forming a pair of box marks on the upper-layer pattern and lower-level pattern of a semiconductor chip, and measuring the misalignment between the box marks. For example, the relative position between a pair of box marks comprising some kind of mark formed on the semiconductor substrate and an alignment mark made of photoresist obtained through the photolithography process may be measured, and the dislocation in the relative position (amount of alignment dislocation) between the lower-layer pattern and the upper-layer pattern may be calculated by calculating the dislocation in the relative position therebetween. Alignment of the lower-layer pattern and upper-layer pattern is performed based on the amount of alignment dislocation.

Japanese Patent Laid-Open No. 9-232221, for example, discloses a semiconductor device and a semiconductor device manufacturing method whereby the relative position is calculated between an interlayer insulating film as a lower-layer pattern and a photoresist layer as an upper-layer pattern by measuring the relative position between a pair of box marks comprising a slit-shaped groove provided in a prescribed region of the interlayer insulating film and an alignment mark made of photoresist provided on a thin film stacked on the interlayer dielectric film.

Box marks used to detect alignment accuracy are provided on a region other than the region comprising elements such as transistors or the like. That is, as shown in FIG. 5, box mark formation regions 2, 3, 4, and 5 are formed on scribe lines 0, not on a chip region (product region) 1. By so doing, it is possible to calculate the amount of alignment dislocation without causing enlargement of the chip area. Moreover, since one box mark formation region is used for each alignment operation, the box mark formation regions used for each alignment operation are different. For this reason, it is necessary to have box alignment regions in at least a number equal to the number of times that alignment is performed.

Here, ease of viewing the box marks may be mentioned as one of the major elements influencing alignment accuracy when alignment of a lower-layer pattern and an upper-layer pattern is performed based on an amount of alignment dislocation calculated from the relative misalignment between box marks. FIG. 6 shows a process, in a conventional semiconductor device and semiconductor device manufacturing method, for forming box marks for alignment in a photolithography process for a conducting material film such as a poly-crystalline silicon layer or the like used as an electrode material in a DRAM. Here, as an example, description will be given in the case in which the box marks are formed in the box mark formation region 2 shown in FIG. 5.

As shown in FIG. 6(A), in a conventional semiconductor device and manufacturing method for a semiconductor device, an interlayer insulating film 27 is provided on a semiconductor substrate 26. The interlayer insulating film 27 is, for example, a film of $SiO_2$, TEOSBPSG (Tetraethoxyorthosilicate Borophosphosilicate glass), or the like. The interlayer insulating film 27 comprises at least two layers or more of interlayer insulating film in the chip region (product region) so that a word line (not shown) made up of elements and a first poly-crystalline silicon layer and a bit line (not shown) made up of elements and a second poly-crystalline silicon layer will be mutually insulated therefrom. At this point, the interlayer insulating film 27 has a thickness of about 1000 nm or thereabouts. A word line and a bit line made up of a first poly-crystalline silicon layer and a second poly-crystalline silicon layer are formed in the chip region (product region) 1, but since no elements such as transistors or the like are formed in the box mark formation region, the word line, the bit line or the like made up of a first poly-crystalline silicon layer and a second poly-crystalline silicon layer is not formed in the box mark formation region 2. As shown in FIG. 6(A), a photoresist 28 is applied to the entire surface of the interlayer insulating film 27.

Next, as shown in FIGS. 6(B) and 6(C), using conventional photoresist techniques and etching techniques, a contact (not shown) for connecting a storage electrode made up of a conducting material film 210 of poly-crystalline silicon or the like is formed on an $n^-$ diffusion layer in the chip region (product region) 1, and at the same time, an opening groove 29-*a* is formed as a box mark in the box mark formation region 2 shown in FIG. 5. Next, after a conducting material film 210 about 500 to 700 nm thick, which is to become a storage electrode, is formed in the chip region (product region) 1 and box mark formation region 2, a photoresist 211 is applied to the entire surface, as shown in FIG. 6(D). Further, as shown in FIG. 6(E), an alignment mark 211-*a* is formed on the conducting material film 210 in the opening groove 29-*a* using conventionally-used photolithography techniques.

FIG. 6(F) shows a plan view corresponding to FIG. 6(E) Normally, the relative positional deviation of the alignment mark 211-*a* and the opening groove 29-*a* shown in FIG. 6(F) is mechanically calculated by applying existing image processing technology. Along with opening groove 29-*a* and alignment mark 211-*a*, FIG. 6(F) shows a waveform 212 showing measurement results data for the misalignment between opening groove 29-*a* and alignment mark 211-*a* obtained by existing image processing technology.

The conventional semiconductor device and conventional semiconductor manufacturing method shown in FIG. 6 have the following problems.

The conventional manufacturing method for semiconductor devices ordinarily includes a plurality of heat treatment processes. The heat treatment of an interlayer insulating film formed on a semiconductor substrate may be mentioned as representative of these.

When some kind of an interlayer insulating film ($SiO_2$ or TEOSBPSG film or the like) is formed on a semiconductor substrate, the interlayer insulating film which is formed will have irregularities on the surface, and will not be flat. For this reason, in order to obtain sufficient flatness in ordinary manufacturing methods for semiconductor devices, flattening is performed by performing heat treatment of the interlayer insulating film and causing reflow (fluidization). At this time, the interlayer insulating film is sufficiently flattened by performing heat treatment at or above the prescribed temperature for causing reflow (fluidization) of the interlayer insulating film. It is further known that if an interlayer insulating film has been caused to reflow once, reflow will not occur again if the temperature does not rise above the temperature (reflow temperature) at the time when the interlayer insulating film was caused to reflow.

Since in conventional semiconductor devices, the semiconductor elements were not that miniature and the level integration was also low, even if the temperature for heat processing with the purpose of flattening the interlayer insulating film was fairly high there was little effect on the device characteristics or semiconductor devices. However, along with the recent miniaturization and greater integration of semiconductor devices, in cases where a high temperature is used as the temperature (reflow temperature) for heat processing when performing flattening, there is a comparatively large effect on device characteristics and semiconductor elements in comparison to conventional semiconductor devices. Therefore, when performing heat processing with the purpose of flattening an interlayer insulating film, a need has arisen to perform the heat processing at as low a temperature as possible within the temperature range at which it is possible to perform sufficient flattening of the interlayer insulating film. Thus the heat processing performed when carrying out flattening has come to be performed at a relatively low reflow temperature in comparison to conventional practice. However, a problem has arisen in that while flattening has come to be performed in this way at temperatures comparatively lower than the conventional practice, the heat treatment temperatures used in processes other than flattening of the interlayer insulating film have risen.

For example, in a semiconductor device and manufacturing method for semiconductor devices as shown in FIG. 6, when heat treatment is applied (for example, under a $N_2$ atmosphere at 850° C. for 10 min.) with the purpose of activating ions injected by an ion injection method following heat treatment at 800° C. (reflow temperature) with the purpose of flattening an interlayer insulating film 27, which is made of $SiO_2$ or TEOSBPSG film or the like, the temperature (850° C.) of the heat treatment process with the purpose of activating the ions is higher than the reflow temperature (800° C.) of the interlayer insulating film 27. This causes deformation of the shape of the interlayer insulating film 27 from the vicinity of the bottom of the side surfaces of the opening groove 29-*a* to the bottom, because the interlayer insulating film 27 is made to reflow again (re-fluidize). The degree of change in shape of the edge part of the opening groove 29-*a* (part from the vicinity of the bottom of the sides of the edge groove 29-*a* to the bottom) is proportional to the volume of the interlayer insulating film 27 adjacent to the outer sides of the opening groove 29-*a*. That is, since the remaining width a"1 is larger in comparison to the remaining width a"2, as shown in FIG. 6(F), the volume of the interlayer insulating film 27 adjacent to the side of the remaining width a"1 will be larger than on the side of the remaining width a"2. For this reason, there is a greater degree of change in shape in the edge part of the opening groove 29-*a* on the side of the remaining width a"1 compared to the edge part on the side of the remaining width a"2, so that it takes on a shape that intrudes into the conducting material film 210 to be formed later. For this reason, when measuring the amount of misalignment of the alignment mark 211-*a* and the opening groove 29-*a* using existing image processing technology, the peak at the edge part of the remaining width a"1 of the opening groove becomes less sharply defined in the waveform 212 of the data showing the misalignment measurement results, as shown in FIG. 6(F). As a result, a problem arises in that it becomes difficult to accurately read the relative amount of alignment dislocation between box marks (between the alignment mark 211-*a* and the opening groove 29-*a*), so that the alignment accuracy between the lower-layer pattern and upper-layer pattern falls remarkably.

BRIEF SUMMARY OF THE INVENTION

Object of the Invention

The present invention was accomplished in consideration of the above problems in the conventional technology. The object of the present invention is to provide a semiconductor device manufacturing method and a semiconductor device which, in photolithography processes among the manufacturing processes for semiconductor devices, are able to raise the accuracy of alignment when performing alignment between an existing pattern on a semiconductor substrate as a lower-layer pattern and a design pattern of the next process as an upper-layer pattern.

Summary of the Invention

A first invention of the present application provided for solving the above problems is a semiconductor device manufacturing method which, along with forming an opening groove in a prescribed region of an interlayer insulating film formed on a semiconductor substrate, comprises the processes of forming a slit with a shape surrounding the opening groove at a position roughly equidistant from the periphery of the opening groove and forming an alignment mark in at least a part of the opening groove.

According to the semiconductor device manufacturing method of the first invention of the present application possessing the above structure, by comprising the processes of forming a slit with a shape surrounding the opening groove at a position roughly equidistant from the periphery of the opening groove and forming an alignment mark in at least a part of the opening groove along with forming an opening groove in a prescribed region of an interlayer insulating film formed on a semiconductor substrate, the interlayer insulating film is placed roughly uniformly between the opening groove and the slit. Thus, it is possible to hold back the change in shape of the edge part of the opening groove to a minimum in the case where the interlayer insulating film is made to reflow again. Furthermore, in this case, even if a change in shape of the edge part of the opening groove occurs to some degree, since the interlayer insulating film is uniformly divided in relation to the center of the opening groove due to the slit with a shape surrounding the opening groove placed in a position roughly equidistant from the periphery of the opening groove, the change in shape of the edge part of the opening groove will be of roughly the same degree in relation to the center of the opening groove. For this reason, when performing alignment measurement, the waveform of the data showing the alignment measurement results at the edge part of the opening groove obtained through said measurement will have a shape that is roughly symmetrical in relation to the center of the opening groove, so that the amount of misalignment may be accurately detected and there will be no lowering of alignment accuracy. In this way, it is possible to raise alignment accuracy.

Next, a semiconductor device manufacturing method of a second invention of the present application comprises the processes of, along with forming an opening groove in a prescribed region of an interlayer insulating film formed on a semiconductor substrate, forming a slit with a rectangular form having roughly the same center as the opening groove and forming an alignment mark on at least a part of the opening groove.

According to the semiconductor manufacturing method of the second invention of the present application possessing the above structure, by comprising the processes of forming a slit with a rectangular form having roughly the same center as the opening groove and forming an alignment mark on at least a part of the opening groove along with forming an opening groove in a prescribed region of an interlayer insulating film formed on a semiconductor substrate, the interlayer insulating film placed between the opening groove and the slit will be roughly uniform in relation to the center of the opening groove. Thus, it will be possible to suppress the change in shape of the edge part of the opening groove to a minimum in the case where reflow is made to occur again in the interlayer insulating film. Again, in this case, even if the shape of the edge part of the opening groove changes to some degree, the interlayer insulating film is divided by the slit with a rectangular form having a center roughly the same as the opening groove, so that the interlayer insulating film placed between the opening groove and the slit will be roughly uniform in relation to the center of the opening groove. For this reason, since a change in the shape of the edge part of the opening groove will occur roughly corresponding to the distance from the center of the opening groove, when misalignment measurements are performed, the waveform of the data showing the misalignment measurement results at the edge part of the opening groove obtained by said measurement will roughly correspond to the distance from the center of the opening groove, and it will be possible to accurately measure the amount of misalignment from the data showing the misalignment measurement results. In this way, it will be possible to raise the alignment accuracy.

Furthermore, a semiconductor manufacturing method of a third invention of the present application comprises the processes of, along with forming an opening groove in a prescribed region of an interlayer insulating film formed on a semiconductor substrate, forming a slit with a frame form positioned so as to be roughly equidistant from the periphery of the opening groove and forming an alignment mark on at least a part of the opening groove.

According to the semiconductor device manufacturing method of the third invention of the present application having the above structure, by including a process for forming a slit with a frame form positioned so as to be roughly equidistant from the periphery of the opening groove and a process for forming an alignment mark on at least a part of the opening groove along with forming an opening groove in a prescribed region of an interlayer insulating film formed on a semiconductor substrate, the interlayer insulating film between the opening groove and the slit is placed roughly uniformly in relation to the center of the opening groove, so that it is possible to suppress the change in shape of the edge part of the opening groove to a minimum in the case that reflow occurs again in the interlayer insulating film. Furthermore, in this case, even if the shape of the edge part of the opening groove changes to some degree, since the interlayer insulating film is divided by the slit with a frame form placed so as to be positioned roughly equidistant from the periphery of the opening groove, the interlayer insulating film between the opening groove and the slit is placed roughly uniformly in relation to the center of the opening groove. For this reason, since a change in shape of the edge part of the opening groove will occur roughly corresponding to the distance from the center of the opening groove, the waveform of the data showing the misalignment measurement results at the edge part of the opening groove will likewise roughly correspond to the distance from the center of the opening groove, so that it will be possible to accurately measure the amount of misalignment from the data showing the misalignment measurement results. In this way, it will be possible to raise the alignment accuracy.

A semiconductor device manufacturing method of a fourth invention of the present application is a semiconductor device manufacturing method of any of the first through third inventions of the present application wherein the width of an alignment mark is set to be smaller than the width of the opening groove.

According to the semiconductor device manufacturing method of the fourth invention of the present application having the above structure, by setting the width of the alignment mark to be smaller than the width of the opening groove, it is possible to place the alignment mark in the inner part of the opening groove, so that the contrast of the alignment mark part will be obvious during misalignment measurement using existing image processing technology, and it will be easy to detect the alignment mark. By doing so, the alignment accuracy may be raised since it will be possible to accurately detect the amount of misalignment between the opening groove and the alignment mark.

A semiconductor device manufacturing method of a fifth invention of the present application is a semiconductor manufacturing method of any of inventions one through four of the present invention wherein an alignment mark is formed as a cut-out structure.

According to the semiconductor device manufacturing method of the fifth invention of the present application having the above structure, an alignment mark is formed as a cut-out structure, but whether the alignment mark has a remaining structure or a cut-out structure is appropriately selected and used in accordance with the product specifications. Thus the amount of misalignment between the opening groove and the alignment mark can be detected accurately, so that alignment accuracy may be raised.

A sixth invention of the present application is a semiconductor device wherein, in a semiconductor device in which part of the opening groove changes to some degree, the semiconductor device will have an interlayer insulating film divided roughly uniformly in relation to the center of the opening groove due to the slit with a shape surrounding the opening groove placed at a position roughly equidistant from the periphery of the opening groove, so that the change in shape of the edge part of the opening groove will be roughly of the same degree in relation to the center of the opening groove. For this reason, when performing misalignment measurement, the waveform of the data showing the misalignment measurement results at the edge part of the opening groove obtained by said measurement will be roughly symmetrical in relation to the center of the opening groove, so that the amount of misalignment may be detected accurately and there will be no lowering of alignment accuracy. In this way, a semiconductor device can be obtained having an optimum relative positional relationship between an existing pattern on a semiconductor substrate and a design pattern of the next process, the semiconductor device may be structured such that it has good product yield and, as a result, the semiconductor device may be obtained at a lower price since it is possible to produce the semiconductor device itself at a lower cost.

A seventh invention of the present application is a semiconductor device wherein, in a semiconductor device in which a pair of box marks for measuring the relative position of an upper-layer pattern and a lower-layer pattern of the semiconductor device have been provided in a box mark region, one a pair of box marks for measuring the relative position of a lower-layer pattern and an upper-layer pattern of a semiconductor device are provided in a box mark formation region, one box mark of the pair of box marks comprises an opening groove formed in a prescribed region of an interlayer insulating film formed on a semiconductor substrate and a slit with a shape surrounding the opening groove placed in a position roughly equidistant from the periphery of the opening groove, while the other box mark of the pair of box marks is an alignment mark formed on the opening groove.

The box mark formation region of the present application is a region for forming box marks and is provided in a region on the semiconductor device where no devices are formed. According to the semiconductor device of the sixth invention of the present application having the above structure, since one box mark of the pair of box marks comprises an opening groove formed in a prescribed region of an interlayer insulating film formed on a semiconductor substrate and a slit with a shape surrounding the opening groove placed in a position roughly equidistant from the periphery of the opening groove, while the other box mark of the pair of box marks is an alignment mark formed on the opening groove, the interlayer insulating film is placed and structured roughly uniformly between the opening groove and the slit. Thus, a semiconductor device can be obtained having an opening groove that holds the change in shape of the edge part to a minimum in the case where reflow occurs again in the interlayer insulating film. Furthermore, in this case, even if the shape of the edge box mark of the pair of box marks comprises an opening groove formed in a prescribed region of an interlayer insulating film formed on a semiconductor substrate and a slit with a rectangular form having roughly the same center as the opening groove, while the other box mark of the pair of box marks is an alignment mark formed on the opening groove.

The box mark formation region of the present application is a region for forming box marks and is provided in a region on the semiconductor device where no devices are formed. According to the semiconductor device of the seventh invention of the present application having the above structure, since one box mark of the pair of box marks comprises an opening groove formed in a prescribed region of an interlayer insulating film formed on a semiconductor substrate and a slit with a rectangular form having roughly the same center as the opening groove, while the other box mark of the pair of box marks is an alignment mark formed on the opening groove, the semiconductor device has an interlayer insulating film placed roughly uniformly between the opening groove and the slit. Thus, a semiconductor device may be obtained that provides an opening groove with which the change in shape of the edge part is suppressed to a minimum in the case where reflow occurs again in the interlayer dielectric film. Furthermore, in this case, even if the shape of the edge part of the opening groove changes to some degree, the change in shape of the edge part of the opening groove will be of roughly the same degree in relation to the center of the opening groove, since an interlayer insulating film has been formed that is apportioned roughly uniformly in relation to the center of the opening groove due to the slit with the rectangular form having a center roughly the same as that of the opening groove. Thus, when performing misalignment measurement, the waveform of the data showing the misalignment measurement results at the edge part of the opening groove gained through said measurement will likewise have a form roughly symmetrical in relation to the center of the opening groove, so that the amount of misalignment may be detected accurately and the alignment accuracy may be maintained. In this way, a semiconductor device can be obtained having an optimum relative positional relationship between an existing pattern on a semiconductor substrate and a design pattern of the next process, the semiconductor device may be structured such that it has good product yield and, as a result, the semiconductor device may be obtained at a lower price since it is possible to produce the semiconductor device itself at a lower cost.

An eighth invention of the present application is a semiconductor device which, in a semiconductor device wherein a pair of box marks for measuring the relative position between a lower-layer pattern and an upper-layer pattern on a semiconductor device are provided in a box mark formation region, one box mark of the pair of box marks comprises a opening groove formed in a prescribed region of an interlayer insulating film formed on a semiconductor substrate and a slit with a frame form placed at a position roughly equidistant from the periphery of the opening groove, while the other box mark of the pair of box marks is an alignment mark formed on the opening groove.

According to the semiconductor device of the eighth invention of the present application possessing the above structure, since one box mark of the pair of box marks comprises a opening groove formed in a prescribed region of an interlayer insulating film formed on a semiconductor substrate and a slit with a frame form placed at a position roughly equidistant from the periphery of the opening groove, while the other box mark of the pair of box marks is an alignment mark formed on the opening groove, the interlayer insulating film is provided so that it is placed roughly uniformly between the opening groove and the slit. Therefore, a semiconductor device may be obtained having an opening groove with which the change in shape of the edge part is suppressed to a minimum in the case where reflow occurs again in the interlayer insulating film. Furthermore, in this case, even if a change in the shape of the edge part in the opening groove occurs to some degree, the interlayer insulating film between the opening groove and the edge part is placed roughly uniformly in relation to the center of the opening groove, since the interlayer insulating film is divided by the slit with a frame form placed at a position roughly equidistant from the periphery of the opening groove. Thus, the change in the shape of the edge part of the opening groove will occur roughly corresponding to the distance from the center of the opening groove, so that the waveform of the data showing the misalignment measurement results at the edge part of the opening groove will likewise have a waveform roughly corresponding to the distance from the center of the opening groove. For this reason, the amount of misalignment may be accurately measured from the data showing the misalignment measurement results. In this way, a semiconductor device can be obtained having an optimum relative positional relationship between an existing pattern on a semiconductor substrate and a design pattern of the next process, the semiconductor device may be structured such that it has good product yield and, as a result, the semiconductor device may be obtained at a lower price since it is possible to produce the semiconductor device itself at a lower cost.

DETAILED DESCRIPTION OF THE PREFERRED EMBODIMENTS

The following is a description, with reference to the drawings, of a semiconductor device manufacturing method and a semiconductor device according to an embodiment of the present invention. However, the following embodiment is only one example of a semiconductor device manufacturing method and a semiconductor device according to an embodiment of the present invention.

(First Embodiment)

Figure 1:
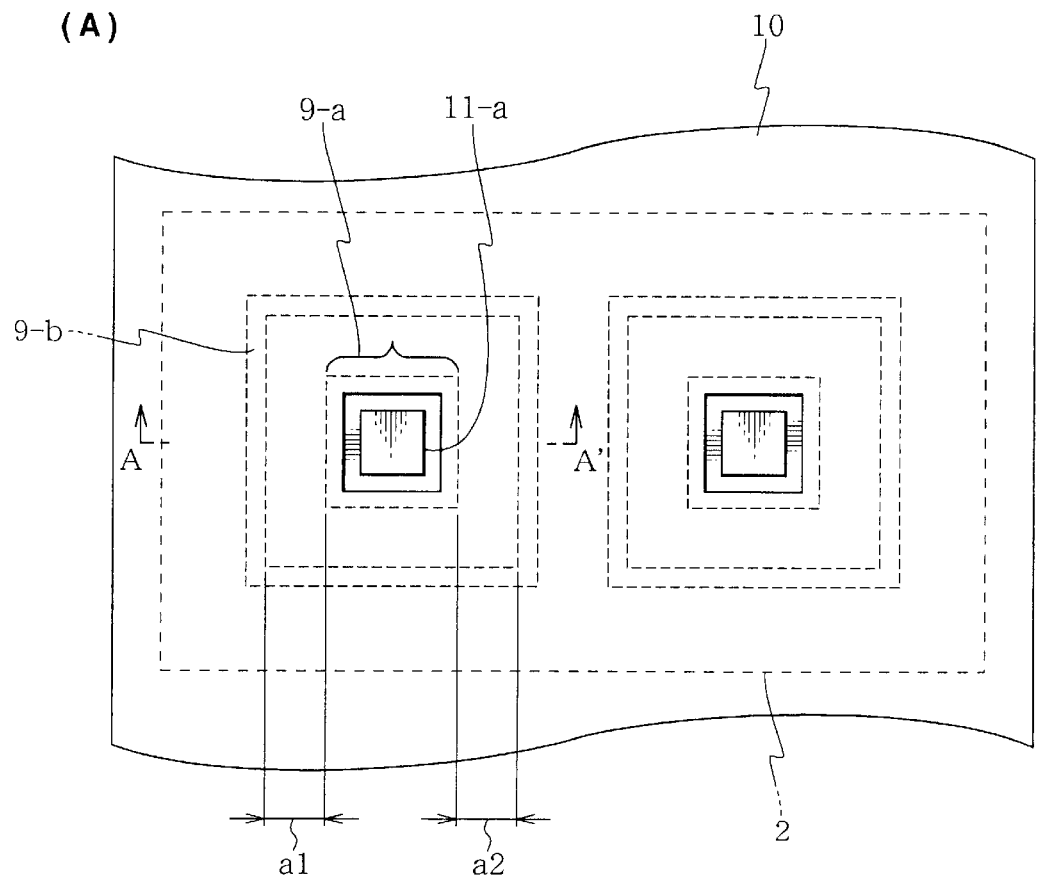
FIGS. 1(A) and 1(B) are diagrams showing box marks placed on a semiconductor device according to a first embodiment of the present invention.
Figure 1:
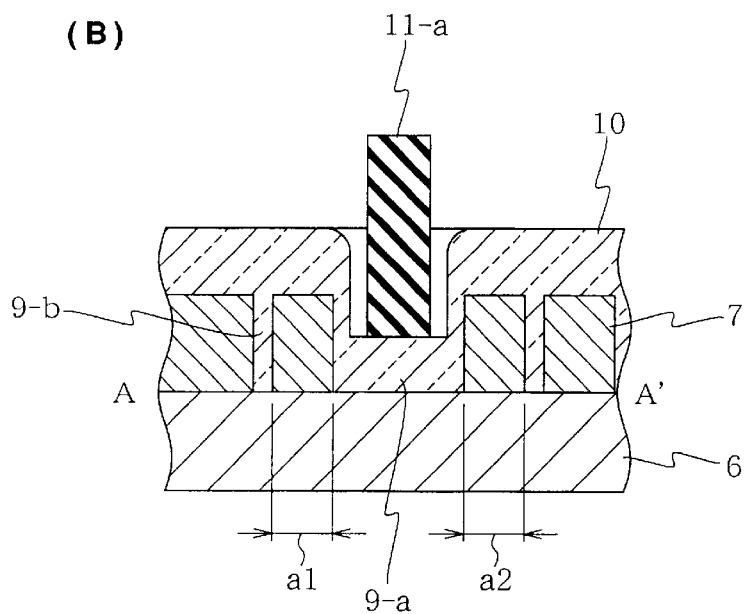
Figure 2:
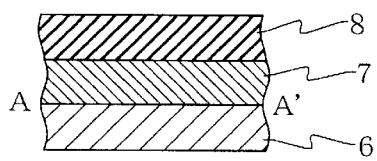
FIGS. 2(A)–2(G) are diagrams showing a manufacturing method for a semiconductor device according to a first embodiment of the present invention.
Figure 2:
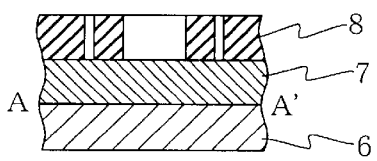
Figure 2:
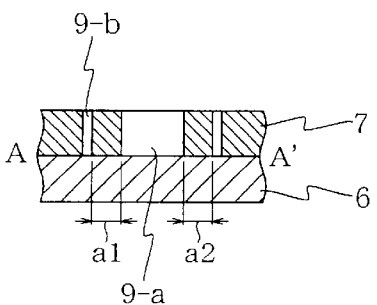
Figure 2:
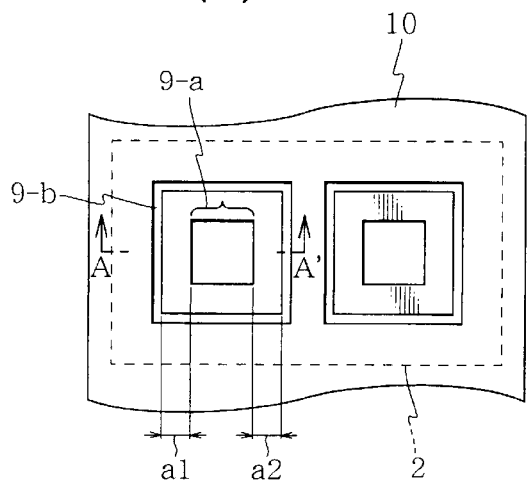
Figure 2:
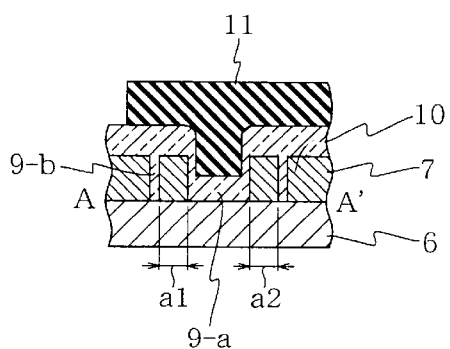
Figure 2:
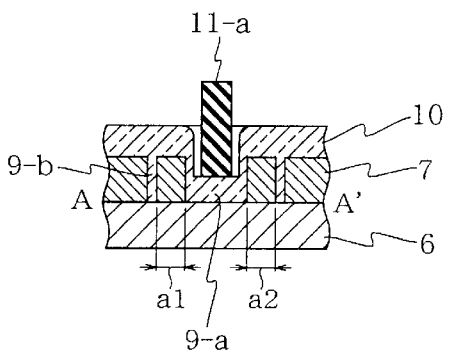
Figure 2:
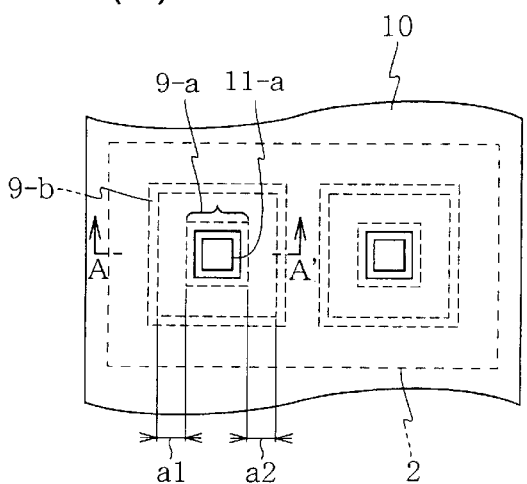

A semiconductor device manufacturing method and a semiconductor device according to an embodiment of the present invention will be described below in detail with reference to FIGS. 1, 2 and 5.

Figure 5:
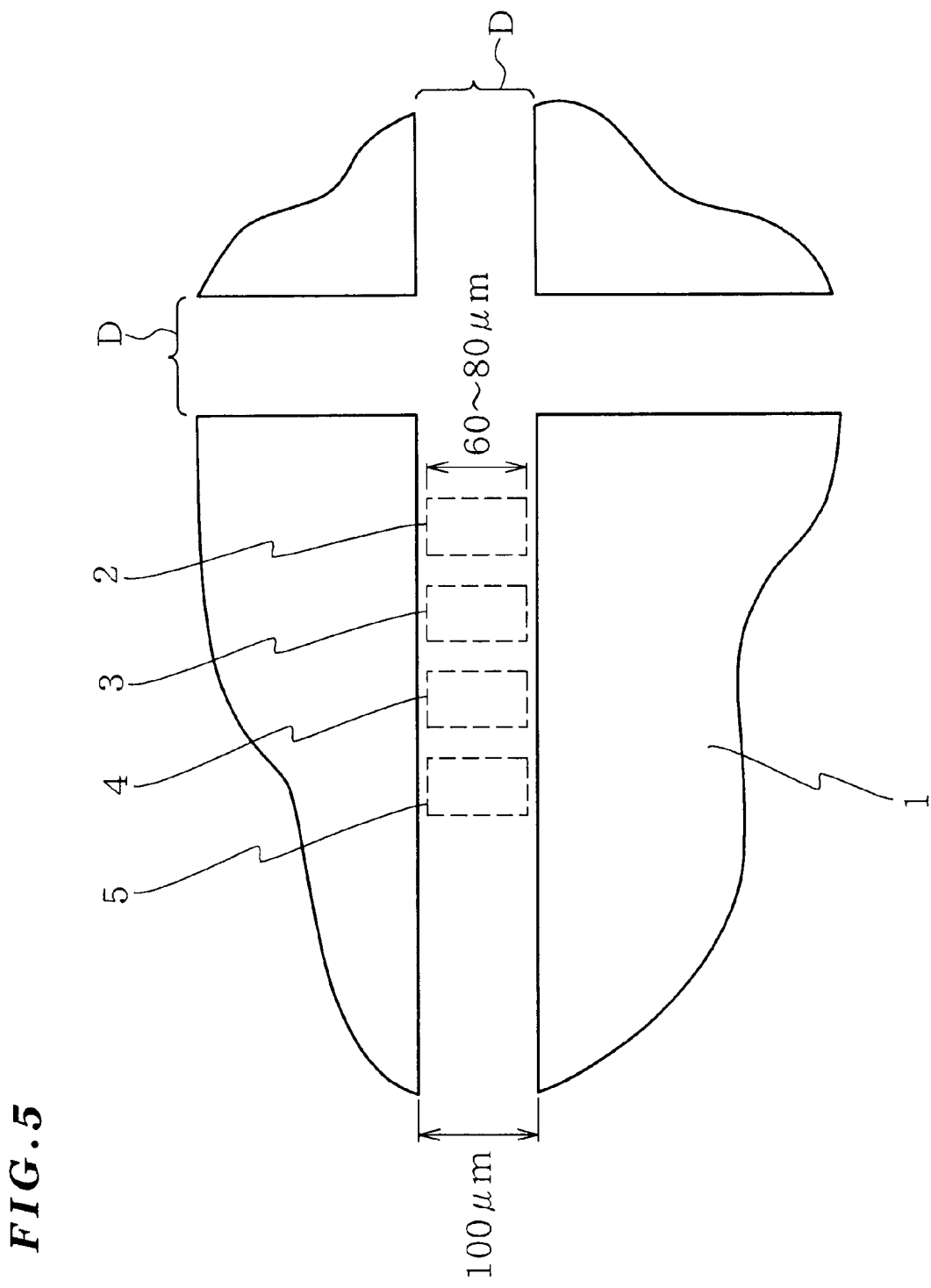
FIG. 5 is a diagram showing a box mark formation region placed on a semiconductor device of the conventional art and of the present invention.
Figure 6:
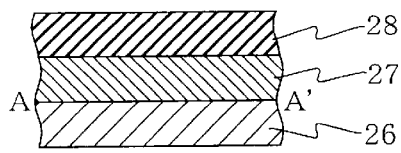
FIGS. 6(A)–6(F) are diagrams showing a conventional semiconductor device semiconductor device manufacturing method.
Figure 6:
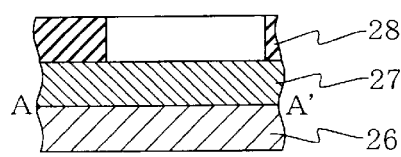
Figure 6:
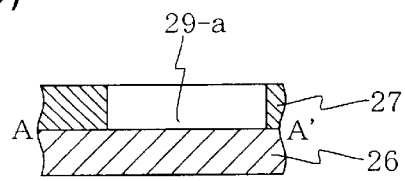
Figure 6:
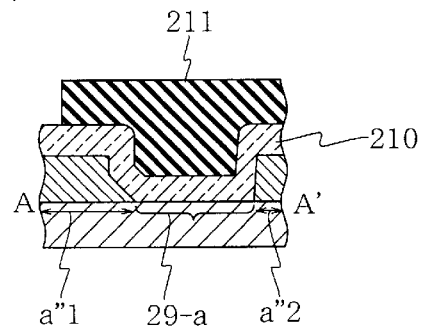
Figure 6:
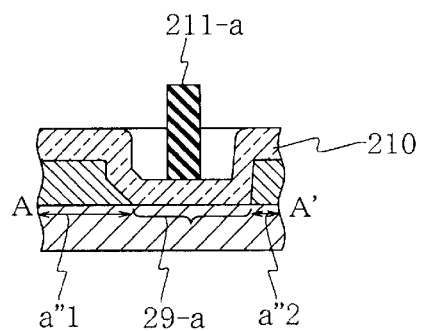
Figure 6:
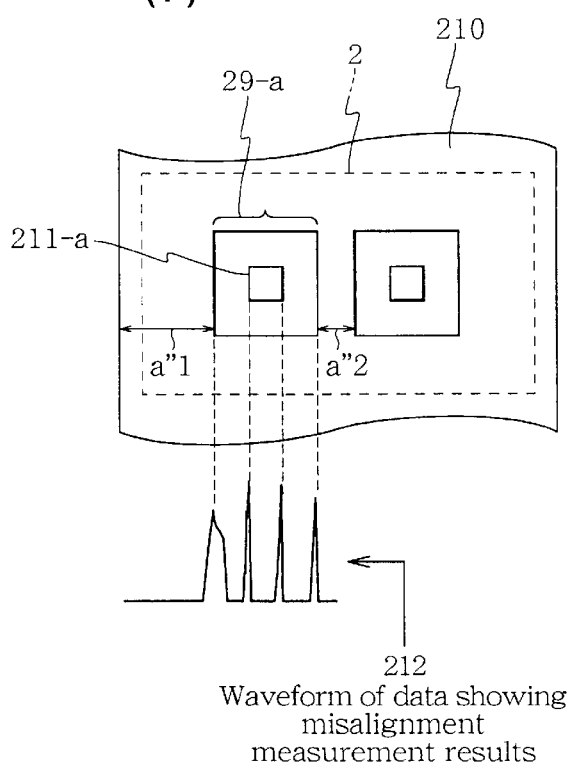

FIG. 5 is a plan view showing a box mark formation region provided on a semiconductor device according to an embodiment of the present invention. In FIG. 5, on scribe lines 0 about 100 $\mu$m in width, which are regions not used for formation of elements on a semiconductor device 1, box mark formation regions 2, 3, 4, and 5 about 60–80 $\mu$m in width are placed. The widths of the scribe lines and box mark formation regions are not limited thereto. These box mark formation regions are each used in one patterning operation only in each respective region. For this reason, box mark formation regions are provided in at least a number equal to the number of patterning operations. In this embodiment, an explanation will be given of the example of a box mark placed in box mark formation region 2. In FIG. 5, two box marks are formed in one box mark formation region. However, the number of box marks formed in one box mark formation region is not limited thereto.

FIG. 1(A) is a drawing showing a pair of box marks placed in a box mark formation region 2 of a semiconductor device according to the present embodiment.

FIG. 1(B) is a cross-sectional view at A–A' of the semiconductor device shown in FIG. 1(A).

FIGS. 2(A) to 2(G) are drawings showing, in the case wherein a semiconductor device of the present embodiment is applied in a DRAM, the sequence of the box mark manufacturing processes in the photolithography process for a conducting material film 10, which is used as an electrode material in the DRAM.

Next, a detailed explanation will be given of a semiconductor device according to the present embodiment. As shown in FIG. 1, two pairs of box marks are placed in a box mark formation region 2 provided on a semiconductor device according to the present embodiment. The pairs of box marks are provided for measuring the relative position of an opening groove 9-$a$ provided on the substrate of the semiconductor device, which is a lower-layer pattern, and an alignment mark 11-$a$ made of a photoresist layer provided on a conducting material layer 10, which is an upper-layer pattern. The box marks are pairs of box marks. One box mark of a pair of box marks is formed of the opening groove 9-$a$ and a slit 9-$b$ with a frame form (the shape surrounding the opening groove 9-$a$) placed at a position roughly equidistant from the periphery of the opening groove 9-$a$. The other box mark of a pair of box marks is an alignment mark 11-$a$ formed on a conducting material film 10 in the opening groove 9-$a$. By using said pair of box marks, it is possible to measure with good accuracy the relative position of the opening groove 9-$a$ provided on the substrate of the semiconductor device, which is the lower-layer pattern, and an alignment mark 11-$a$ made up of the photoresist layer provided on the conducting material layer 10, which is the upper-layer pattern.

Next, a detailed explanation will be given of a semiconductor device manufacturing method according to the present embodiment. As shown in FIG. 2(A), in a semiconductor device manufacturing method according to the present embodiment, an interlayer insulating film 7 is provided on a semiconductor substrate 6 made up of p-silicon or the like. The interlayer insulating film 7 is, for example, SiO$_2$, TEOSBPSG film or the like. A storage electrode made of a conducting material film 10 of a third poly-crystalline silicon layer or the like in a chip region (product region) 1 (shown in FIG. 5) and a contact for connecting to an n-dispersion layer are formed while the interlayer insulating film 7 is being provided on the semiconductor substrate 6. So that a word line (not shown) made up of elements and a first poly-crystalline silicon layer and a bit line (not shown) made up of elements and a second poly-crystalline silicon layer in the chip region (product region) 1 will be mutually insulated therefrom, the interlayer insulating film 7 is formed of at least two layers of interlayer insulating film. At this time, the thickness of the interlayer insulating film 7 is about 1000 nm. A word line and a bit line made up of first and second poly-crystalline silicon layers are formed in the chip region (product region) 1, but the word line and bit line made up of first and second poly-crystalline silicon layers are not formed in the box mark formation region 2 so that elements such as transistors or the like are not formed in the box mark formation region 2. Next, as shown in FIG. 2(A), a photoresist 8 is applied on the upper surface of the interlayer insulating film 7.

Next, as shown in FIGS. 2(B) and 2(C), at the same time that a contact (not shown) for connecting a storage electrode made up of a conducting material film 10 on the n diffusion layer is formed in the chip region (product region) 1 using generally-used photolithography and etching techniques, an opening groove 9-*a* and a slit 9-*b*, which are one of a pair of box marks, are formed in the box mark formation region 2. As shown in FIG. 2(C), the slit 9-*b* is formed so that the distance from the four sides comprising the opening groove 9-*a* up to the four sides comprising the slit 9-*b* will be roughly equal. For example, the slit 9-*b* may be formed in a frame form about 1 $\mu$m in width, and the slit 9-*b* may be provided in a form that surrounds the periphery of the opening groove 9-*a* so that the remaining widths a1 and a2 will be about 10 $\mu$m. A plan view corresponding to FIG. 2(C) is shown in FIG. 2(D). According to the above structure, the interlayer insulating film 7 is divided by the slit 9-*b* so that the remaining widths a1 and a2 on the interlayer insulating film 7 adjacent to the opening groove 9-*a* will be of roughly the same length. Following the process described above, heat treatment (for example, under an atmosphere of $N_2$ at 850° C. for 10 min.) is performed with the purpose, for example, of activating ions injected by an ion injection method. In the case of a conventional semiconductor device and semiconductor device manufacturing method, reflow will occur again in the interlayer insulating film 7 if the temperature of the heat treatment with the purpose of said activation or the like is higher than the reflow temperature of the interlayer insulating film 7 (temperature for heat processing when performing flattening of the interlayer insulating film 7). As a result, the edge part of the opening groove 9-*a* (part from the vicinity of the bottom of the sides of the opening groove 9-*a* to the bottom) will remarkable change in shape, and thus the alignment accuracy will be lowered since the contrast of the edge part of the opening groove 9-*a* will become unclear. However, in a semiconductor device according to the present embodiment, by using a pair of box marks, even if reflow occurs again in the interlayer insulating film 7, it is possible to prevent worsening of the shape such that the interlayer insulating film 7 intrudes into the material film (the conducting material film 10 in the present embodiment) provided on the opening groove 9-*a* due to a change in shape of the edge part of the opening groove 9-*a* (part from the vicinity of the bottom of the sides of the opening groove 9-*a* to the bottom). Thus it is possible to easily avoid a lowering of alignment accuracy due to the contrast of the edge part of the opening groove 9-*a* becoming unclear. In the case of a conventional semiconductor device and semiconductor device manufacturing method, deformation in the shape of the edge part of the opening groove 9-*a* is proportional to the volume of the interlayer insulating film 7 adjacent to the periphery of the opening groove 9-*a*, so the greater the volume of the interlayer insulating film 7, the greater the effect due to having the interlayer insulating film 7 reflow again. Therefore, by contracting the remaining widths a1 and a2 of the interlayer insulating film 7 adjacent to the opening groove 9-*a* to an extent that there will be no obstruction during misalignment measurement by dividing the interlayer insulating film 7 with using the slit 9-*b*, the interlayer insulating film 7 can be easily prevented from becoming a shape that intrudes into the material film (the conducting material film 10 in this embodiment) provided on the opening groove 9-*a* due to a change in the shape of the edge part of the opening groove 9-*a*. Thus a lowering in the contrast of the edge part of the opening groove 9-*a* during measurement of misalignment between box marks can be prevented. Furthermore, in this case, even if a change in the shape of the edge part of the opening groove 9-*a* occurs to some degree, the change in shape of the edge part of the opening grove 9-*b* will be of the same degree in relation to the center of the opening groove 9-*a*, since the interlayer insulating film 7 is divided roughly equally in relation to the center of the opening groove 9-*a* by the slit 9-*b*. Thus the waveform of the data showing the misalignment measurement results at the edge part of the opening groove 9-*a* will likewise be obtained in a shape which is the same in relation to the center of the opening groove 9-*a*, so that no lowering of alignment accuracy will be caused. In this way, it will be possible to raise the alignment accuracy.

Next, as shown in FIG. 2(E), a photoresist 11 is applied to the entire surface after forming a conductive material film 10 made up of a third poly-crystalline silicon layer about 500 to 700 nm in thickness, which is to become a storage electrode (not shown) on the chip region (product region) 1. Then, as shown in FIG. 2(F), an alignment mark, which is the other box mark of a pair of box marks, is formed on the conductive material film 10 in the opening groove 9-*a* using generally-used photolithography techniques. A plan view corresponding to FIG. 2(F) is shown in FIG. 2(G). Generally, as shown in FIG. 2(G), it is possible to measure the relative position of a lower-layer pattern provided on the substrate of a semiconductor device and an upper-layer pattern provided on the lower-layer pattern by mechanically calculating the amount of relative dislocation of the alignment mark 11-*a* made of photoresist and the opening groove 9-*a*, as shown in FIG. 2(G), by applying existing image processing technology.

(Second Embodiment)

A semiconductor device and a semiconductor device manufacturing method according to another embodiment of the present invention will be described with reference to FIGS. 3 and 4.

FIG. 3(A) is a drawing showing a pair of box marks placed in a box mark formation region 2 of a semiconductor device according to a second embodiment of the present invention.

FIG. 3(B) is a cross-sectional view at A–A' on the semiconductor device shown in FIG. 3(A).

FIGS. 4(A) to 4(G) are drawings showing the sequence of a box mark manufacturing process in a photolithography process for a conducting material film 110 made of a third poly-crystalline silicon layer or the like, which is to be used as an electrode material in the DRAM in the case where the semiconductor device according to the second embodiment of the present invention is applied to the DRAM.

Figure 3:
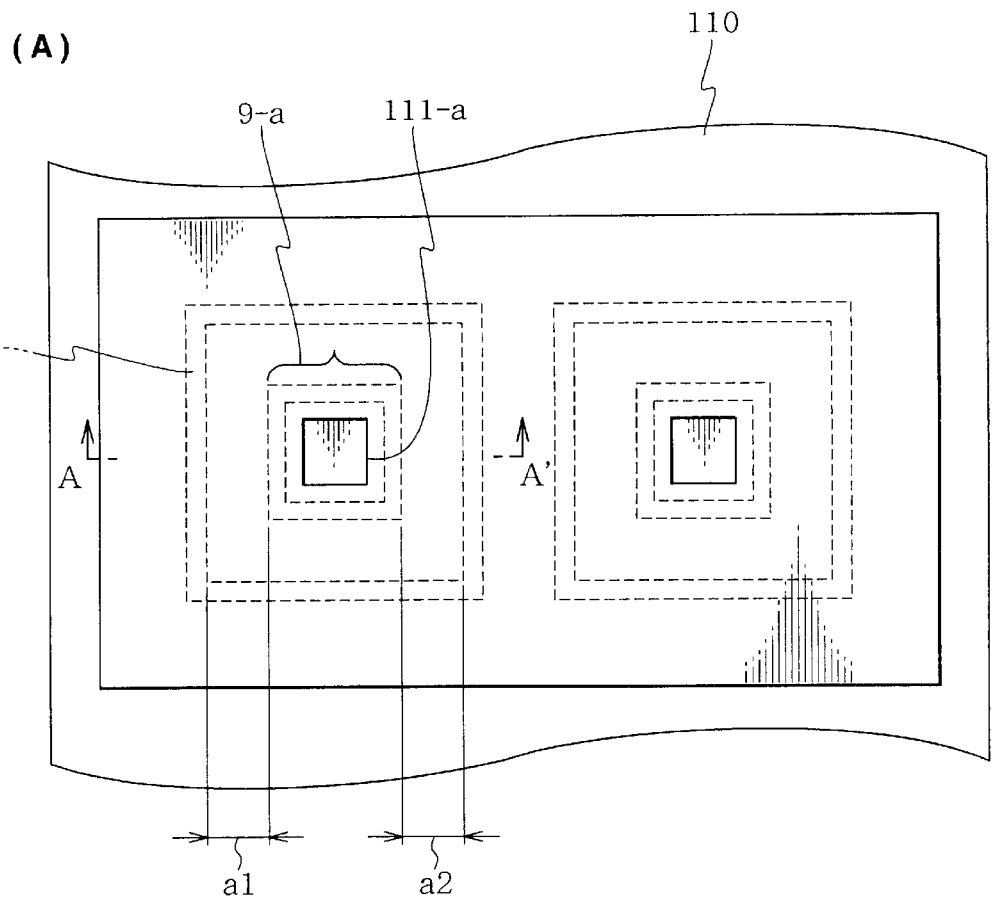
FIGS. 3(A) and 3(B) are diagrams showing box marks placed on a semiconductor device according to a second embodiment of the present invention.
Figure 3:
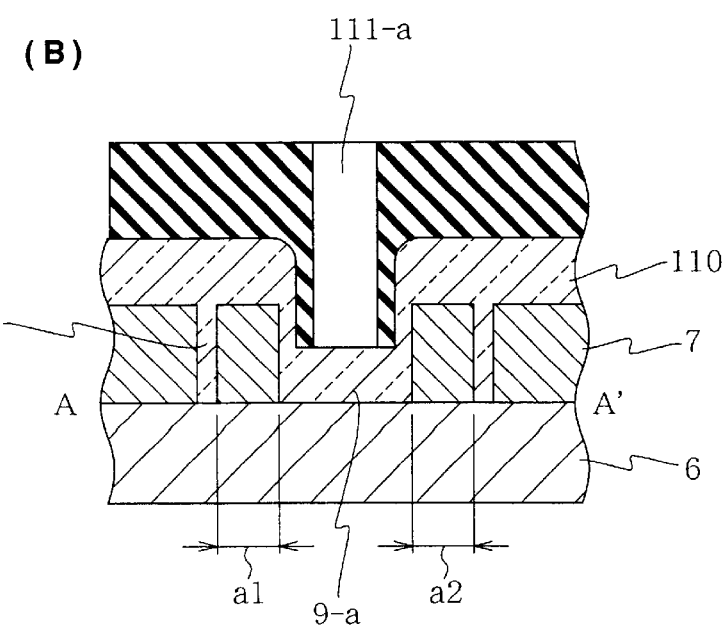
Figure 4:
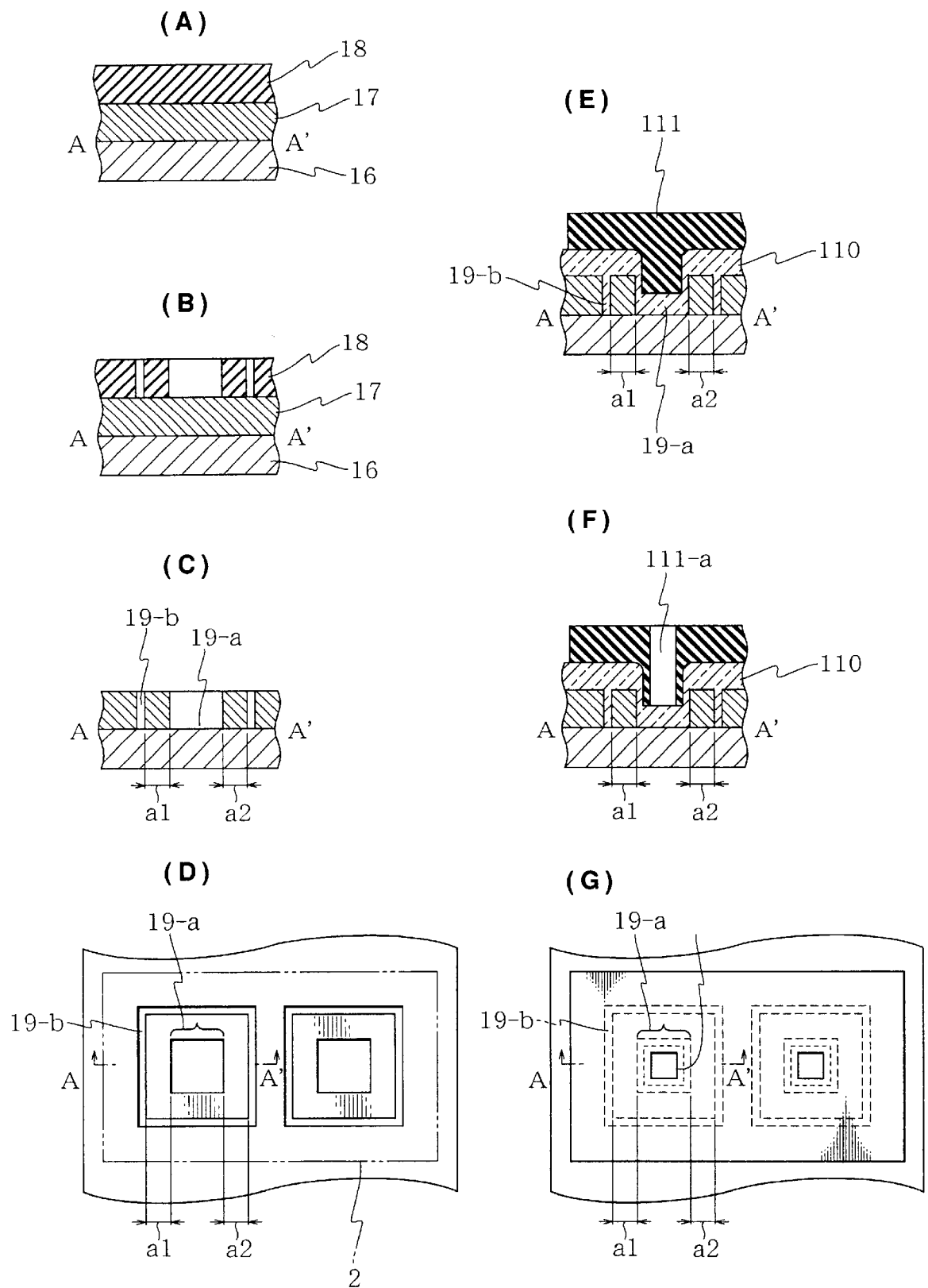
FIGS. 4(A)–4(G) are diagrams showing a manufacturing method for a semiconductor device according to a second embodiment of the present invention.

The semiconductor device and semiconductor device manufacturing method according to the second embodiment of the present invention shown in FIGS. 3 and 4 are roughly the same as the semiconductor manufacturing method of the first embodiment of the present invention (refer to FIGS. 2(A) to 2(E)) explained previously up to the processes for providing the conducting material film made of a third poly-crystalline silicon layer about 500 to 700 nm in thickness, which is to become a storage electrode in the chip region (product region) 1, and for providing the photoresist over the entire surface (the processes shown in FIGS. 4(A) to 4(E)), so a detailed description will be omitted.

The semiconductor device of the present embodiment is the same as the first embodiment of the present invention in that one box mark of a pair of box marks comprises an opening groove 19-*a* formed in a prescribed region of an interlayer insulating film 17 formed on a semiconductor substrate and a slit 19-*b*, but it differs in that the other box mark of the pair of box marks is an alignment mark 111-*a* formed as a cut-out structure through reversal of the mask data, rather than an alignment mark having a remaining structure as in the semiconductor device according to the first embodiment of the present invention.

In the semiconductor manufacturing method of the present embodiment, an alignment mark 111-*a* is formed on a conducting material film 110 in an opening groove 19-*a* using existing photolithography technology, as shown in FIG. 4(F). Here, the alignment mark 111-*a* differs from the alignment mark having a remaining structure placed on the semiconductor device according to the previously-described first embodiment of the present invention, and is formed as a cut-out structure by reversing the mask data. A plan view corresponding to the cross-sectional view shown in FIG. 4(F) is shown in FIG. 4(G). As shown in FIG. 4(G), the misalignment is detected in the horizontal direction (section A–A') in the semiconductor device and semiconductor device manufacturing method according to the present embodiment, but it can also easily be applied in the case of detection in the vertical direction. Furthermore, the semiconductor device and semiconductor device manufacturing method according to the present embodiment show box marks and a box mark manufacturing process in a photolithography process for a conducting material film of polycrystalline silicon layer or the like, which is to be used as an electrode material in a DRAM, but needless to say, the semiconductor device and semiconductor device manufacturing method according to the present embodiment may be applied in other lithography processes and other semiconductor devices and semiconductor device manufacturing processes.

As described above, the semiconductor device manufacturing process according to the present invention can, by including a process for forming a slit with a shape surrounding an opening groove in a position roughly equidistant from the periphery of the opening groove and a process for forming an alignment mark in at least a part of the opening groove while forming an opening groove in a prescribed region of an interlayer insulating film formed on a semiconductor substrate, reduce and place the remaining width of the interlayer insulating film between the opening groove and the slit to an extent that it does not interfere during misalignment measurement and by so doing, can hold the change in the shape of the edge part of the opening groove to a minimum if reflow occurs again in the interlayer insulating film, since the interlayer insulating film is placed roughly equidistant from the periphery of the opening groove. Furthermore, in this case, even if the shape of the edge part of the opening groove changes to some degree, the change in shape of the edge part of the opening groove will be of roughly the same degree in relation to the center of the opening groove since the interlayer insulating film is divided roughly uniformly in relation to the center of the opening groove by a slit with a form that surrounds the opening groove placed in a position roughly equidistant from the periphery of the opening groove. Thus, when performing misalignment measurement, the waveform of data showing the misalignment measurement results at the edge part of the opening groove obtained during said measurement will have a shape roughly symmetrical in relation to the center of the opening groove, so that it will be possible to accurately detect the amount of misalignment and there will be no lowering of alignment accuracy. In this way, it will be possible to raise alignment accuracy.

Furthermore, the semiconductor manufacturing method of the present invention can, by including a process for forming a slit with a rectangular form having a center roughly the same as that of the opening groove and a process for forming an alignment mark in at least a part of the opening groove while forming an opening groove in a prescribed region of an interlayer insulating film formed on a semiconductor substrate, reduce and place the remaining width of the interlayer insulating film placed between the opening groove and the slit to an extent that it does not interfere during misalignment measurement, and by so doing can suppress the change in shape of the edge part of the opening groove to a minimum if reflow occurs again in the interlayer insulating film, since the interlayer insulating film placed between the opening groove and the slit will be roughly uniform in relation to the center of the opening groove. Furthermore, in this case, even if the shape of the edge part of the opening groove changes to some degree, the change in shape of the edge part of the opening groove will occur roughly corresponding to the distance from the center of the opening groove since the interlayer insulating film placed between the opening groove and the slit is roughly uniform in relation to the center of the opening groove, because the interlayer insulating film is divided by a slit with a rectangular form having a center roughly the same as that of the opening groove. Thus, when performing misalignment measurement, the waveform of the data showing the misalignment measurement results at the edge part of the opening groove obtained during said measurement will roughly correspond to the distance from the center of the opening groove, and it will be possible to accurately measure the amount of misalignment from the data showing the misalignment measurement results. In this way, it will be possible to raise alignment accuracy.

Furthermore, the semiconductor device manufacturing method of the present invention can, by including a process for forming a slit with a frame form positioned roughly equidistant from the periphery of the opening groove and a process for forming an alignment mark in at least a part of the opening groove while forming an opening groove in a prescribed region of an interlayer insulating film formed on a semiconductor substrate, reduce and place the remaining width of the interlayer insulating film placed between the opening groove and the slit to an extent wherein it does not interfere during misalignment measurement, and by so doing can suppress the change of shape in the edge part of the opening groove to a minimum if reflow occurs again in the interlayer insulating film, since the interlayer insulating film between the opening groove and the slit is placed roughly uniformly in relation to the center of the opening groove. Furthermore, in this case, even if the shape of the edge part of the opening groove changes to some degree, the edge part of the opening groove will change in shape roughly corresponding to the distance from the center of the opening groove, because the interlayer insulating film between the opening groove and the slit will be placed roughly uniformly in relation to the center of the opening groove since the interlayer insulating film is divided by a slit with a frame shape placed so as to be positioned roughly equidistant from the periphery of the opening groove. Thus the waveform of the data showing the misalignment measurement results at the edge part of the opening groove will likewise roughly correspond to the distance from the center of the opening groove, so that it will be possible to accurately measure the amount of misalignment from the data showing the misalignment measurement results. In this way, it will be possible to raise the alignment accuracy.

Furthermore, a semiconductor device according to the present invention can, by providing a pair of box marks for measuring the relative position between a lower-layer pattern and an upper-layer pattern of the semiconductor device in a box mark formation region, with one box mark of the pair of box marks comprising an opening groove formed in a prescribed region of an interlayer insulating film formed on a semiconductor substrate and a slit with a form that surrounds the opening groove placed in a position roughly equidistant from the periphery of the opening groove and with the other box mark of the pair of box marks being an alignment mark formed on the opening groove, can be obtained as a semiconductor device having an opening groove that stops change in shape of the edge part to a minimum if reflow occurs again in the interlayer insulating film, since the interlayer insulating film is structured so that it is placed roughly uniformly between the opening groove and the slit. Furthermore, in this case, even if the shape of the edge part of the opening groove changes to some degree, since the semiconductor device according to the present invention will have interlayer insulating film divided roughly uniformly in relation to the center of the opening groove by a slit with a form surrounding the opening groove placed in a position roughly equidistant from the periphery of the opening groove, the change in shape of the edge part of the opening groove will be roughly of the same degree in relation to the center of the opening groove. Thus, when performing misalignment measurements, the waveform of the data showing the misalignment measurement results at the edge part of the opening groove obtained by said measurements will have a shape roughly symmetrical in relation to the center of the opening groove, so that the amount of misalignment may be accurately detected and there will be no lowering in alignment accuracy. According to the above, a semiconductor device of the present invention may be obtained as a semiconductor device having an optimum relative positional relationship between a pattern existing on the semiconductor substrate and a design pattern of the next process, and for this reason can be structured as a semiconductor device with good product yield and be obtained at a low price since as a result it is possible to produce the semiconductor device itself at low cost.

Furthermore, since a semiconductor device of the present invention has interlayer insulating film placed roughly uniformly between the opening groove and the slit by providing a pair of box marks for measuring the relative position between a lower-layer pattern and an upper-layer pattern of the semiconductor device in a box mark formation region, with one box mark of the pair of box marks comprising an opening groove formed in a prescribed region of an interlayer insulating film formed on a semiconductor substrate and a slit with a rectangular form having a center roughly the same as that of the opening groove, and with the other box mark of the pair of box marks being an alignment mark formed on the opening groove, a semiconductor device of the present invention can be obtained as a semiconductor device wherein an opening groove is provided such that the change in shape of the edge part is suppressed to a minimum if reflow occurs again in the interlayer insulating film. Furthermore, in this case, even if the shape of the edge part of the opening slit changes to some degree, the change in shape of the edge part of the opening groove will be of roughly the same degree in relation to the center of the opening groove since interlayer insulating film is formed so as to be divided roughly uniformly in relation to the center of the opening groove by a slit with a rectangular shape having a center roughly the same as that of the opening groove. Thus, when performing misalignment measurements, the waveform of the data showing the misalignment measurement results at the edge part of the opening groove obtained by said measurements will likewise be of a shape roughly symmetrical in relation to the center of the opening groove, so that the amount of misalignment may be accurately detected and alignment accuracy may be maintained. According to the above, a semiconductor device of the present invention may be obtained as a semiconductor device having an optimum relative positional relationship between a pattern existing on the semiconductor substrate and a design pattern of the next process, and for this reason can be structured as a semiconductor device with good product yield and be obtained as a low-priced semiconductor since as a result production at a low cost is possible.

Furthermore, a semiconductor device according to the present invention can, by providing a pair of box marks for measuring the relative position between a lower-layer pattern and an upper-layer pattern of the semiconductor device in a box mark formation region, with one box mark of the pair of box marks comprising an opening groove formed in a prescribed region of an interlayer insulating film formed on a semiconductor substrate and a slit with a frame form placed in a position roughly equidistant from the periphery of the opening groove, and with the other box mark of the pair of box marks being an alignment mark formed on the opening groove, can be obtained as a semiconductor device having an opening groove wherein a change in shape of the edge part will be suppressed to a minimum even if reflow occurs again in the interlayer insulating film, since the interlayer insulating film is provided so as to be placed roughly uniformly between the opening groove and the slit. Furthermore, in this case, even if the shape of the edge part of the opening slit changes to some degree, the change in shape of the edge part of the opening groove will occur roughly corresponding to the distance from the center of the opening groove because the interlayer insulating film is placed roughly uniformly between the opening groove and the edge part in relation to the center of the opening groove, since the interlayer insulating film is divided by a slit with a frame shape placed at a position roughly equidistant from the periphery of the opening groove. Thus the waveform of the data showing the misalignment measurement results at the edge part of the opening groove will likewise be a waveform roughly corresponding to the distance from the center of the opening groove, and it will be possible to accurately measure the amount of misalignment from data showing misalignment measurement results. According to the above, a semiconductor device of the present invention may be obtained as a semiconductor device having an optimum relative positional relationship between a pattern existing on the semiconductor substrate and a design pattern of the next process and, for this reason, as a result of being structured as a semiconductor device with good product yield, can be obtained as a low-price semiconductor device since the semiconductor device itself can be produced at low cost.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. A10-304904 (filed on Oct. 27$^{th}$, 1998) including specification, claims, drawings and summary are incorporated herein by reference in its entirety.

What is claimed is:

1. A semiconductor device manufacturing method, comprising the processes of:

forming a slit with a shape surrounding an opening groove at a position roughly equidistant from the periphery of the opening groove while forming said opening groove in a prescribed region of an interlayer insulating film formed on a semiconductor substrate; and forming an alignment mark on at least a part of said opening groove.

2. The semiconductor device manufacturing method according to claim 1, wherein said slit is formed by a slit with a rectangular form having a center roughly the same as the center of said opening groove.

3. The semiconductor device manufacturing method according to claim 1, wherein said slit is formed in a frame shape so as to be positioned roughly equidistant from the periphery of said opening groove.

4. The semiconductor device manufacturing method according to claim 1, wherein the width of said alignment mark is set so as to be smaller than the width of the opening groove.

5. The semiconductor device manufacturing method according to claim 2, wherein the width of said alignment mark is set so as to be smaller than the width of the opening groove.

6. The semiconductor device manufacturing method according to claim 3, wherein the width of said alignment mark is set so as to be smaller than the width of the opening groove.

7. The semiconductor device manufacturing method according to claim 1, wherein said alignment mark is formed as a cut-out structure.

8. The semiconductor device manufacturing method according to claim 2, wherein said alignment mark is formed as a cut-out structure.

9. The semiconductor device manufacturing method according to claim 3, wherein said alignment mark is formed as a cut-out structure.

10. The semiconductor device manufacturing method according to claim 4, wherein said alignment mark is formed as a cut-out structure.

* * * * *